United States Patent [19]

Horvath

[11] Patent Number: 4,648,167

[45] Date of Patent: Mar. 10, 1987

[54] ASSEMBLING ROBOT COMPRISING A COLLECTIVE TRANSPORT DEVICE FOR TRANSPORTING PARTS TO BE ASSEMBLED, ASSEMBLING METHOD AND APPLICATIONS THEREOF

[75] Inventor: Laszlo S. Horvath, Genéve, Switzerland

[73] Assignee: C O D Inter Techniques SA, Geneva, Switzerland

[21] Appl. No.: 724,826

[22] PCT Filed: Aug. 22, 1984

[86] PCT No.: PCT/CH84/00131
§ 371 Date: Apr. 15, 1985
§ 102(e) Date: Apr. 15, 1985

[87] PCT Pub. No.: WO85/01002
PCT Pub. Date: Mar. 14, 1985

[30] Foreign Application Priority Data

Aug. 26, 1983 [CH] Switzerland ............... 4691/83

[51] Int. Cl.[4] .............. B21D 39/03; B23Q 17/00; B23P 21/00
[52] U.S. Cl. ............................. 29/428; 29/407; 29/701; 29/703
[58] Field of Search ............... 29/701–703, 29/407, 428

[56] References Cited

U.S. PATENT DOCUMENTS 4,080,730 3/1978 Woodman ..................... 29/701
4,476,627 10/1984 Matsuura et al. ............... 29/703

OTHER PUBLICATIONS

IEEE Transactions on Computer "An Experimental System for Computer Controlled Mechanical Assembly" vol. 24, #9, pp. 879–888, Sep. 1975.

Primary Examiner—Mark Rosenbaum
Assistant Examiner—Steven Nichols
Attorney, Agent, or Firm—Trexler, Bushnell & Wolters

[57] ABSTRACT

A robot intended to the assembly of constitutive parts of objects comprises at least one working head (4) provided with a tool (8) effecting above a working area (9) motions controlled by a program according to at least three degrees of freedom and, within said working area (9), a device (14) providing for the accurate positioning of the parts to be manipulated in predetermined positions and orientations. It is characterized in that it comprises at least one removable preformed receptacle (17) providing for the collective transport of parts to be assembled to or from the working area (9), said receptacle being configured to maintain with a certain tolerance said parts in relative positions and orientations similar to those determined by the device (14) and arranged to cooperate with the latter. Assembly process implementing a robot such as hereabove defined and its application to the assembly in series of constitutive parts of objects.

8 Claims, 9 Drawing Figures

ASSEMBLING ROBOT COMPRISING A COLLECTIVE TRANSPORT DEVICE FOR TRANSPORTING PARTS TO BE ASSEMBLED, ASSEMBLING METHOD AND APPLICATIONS THEREOF

The present invention relates to a robot designed for assembling constitutive parts of objects, an assembling method using the robot, and the utilization of the method for assembling in series the constitutive parts of objects.

At present, the use of industrial robots is becoming increasingly diversified: new sections of the industry are progressively introducing the use of robots into areas where they were previously unknown; also, the operations robots are required to carry out are evolving to become for example more complex, more delicate, or more accurate. In manufacturing operations where large series of objects are processed, steps such as for example assembling, fitting, screwing or welding need to be done very accurately. Consequently, the objects have to be positioned very accurately on the working area.

Although the parts to be assembled can be positioned on the working area as accurately as needed by appropriate positioning devices, the processing of large series of objects requires a number of ancillary operations which are complex, and therefore slow down the whole operation. The problem which still remains to be solved today concerns the transport of the parts to the working area and their placement in contact with certain constitutive elements of the positioning system to give them the position and the orientation they need to have in the subsequent assembling step. These parts are still very often positioned by hand. In other cases, and in particular for transporting and positioning in series parts on the working area, plates are used for ensuring this positioning. Such plates can be made for example from thermoplastic material. The present day techniques of molding or thermoforming for example cannot provide plates which would adapt with a sufficient degree of accuracy to the parts which are to be manipulated, in particular when some of the steps mentioned above are to be carried out. In fact, the assembling robots known at this time cannot be used for transporting and positioning collectively and rationally series of parts to be assembled. These problems are advantageously overcome by using the robot of the present invention.

The present invention has precisely for object a robot designed for assembling constitutive parts of objects comprising at least one working head with a tool for performing above the working area with at least three degrees of freedom movements controlled by a program and a device in the working area providing for an accurate positioning of the parts to be manipulated in predetermined positions and orientations, characterized in that it comprises at least one removable preformed receptacle providing for the collective transport of the parts to be assembled to or from the working area, said receptacle being configured to maintain with a certain tolerance said parts in relative positions and orientations similar to those determined by the device and arranged to coperate with the latter.

The appended drawings illustrate purely by way of examples certain embodiments of the invention described above.

Figure 3:
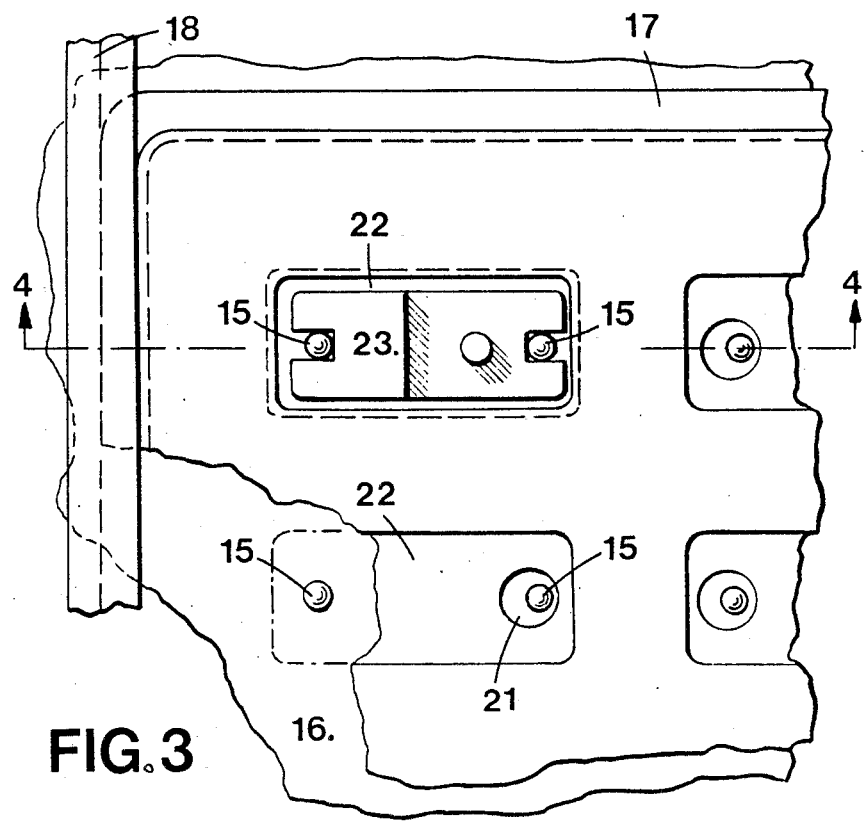
Figure 4:
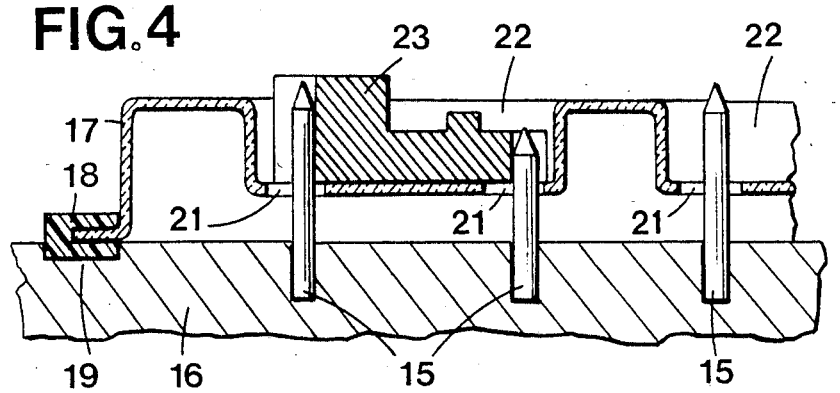
Figure 5:
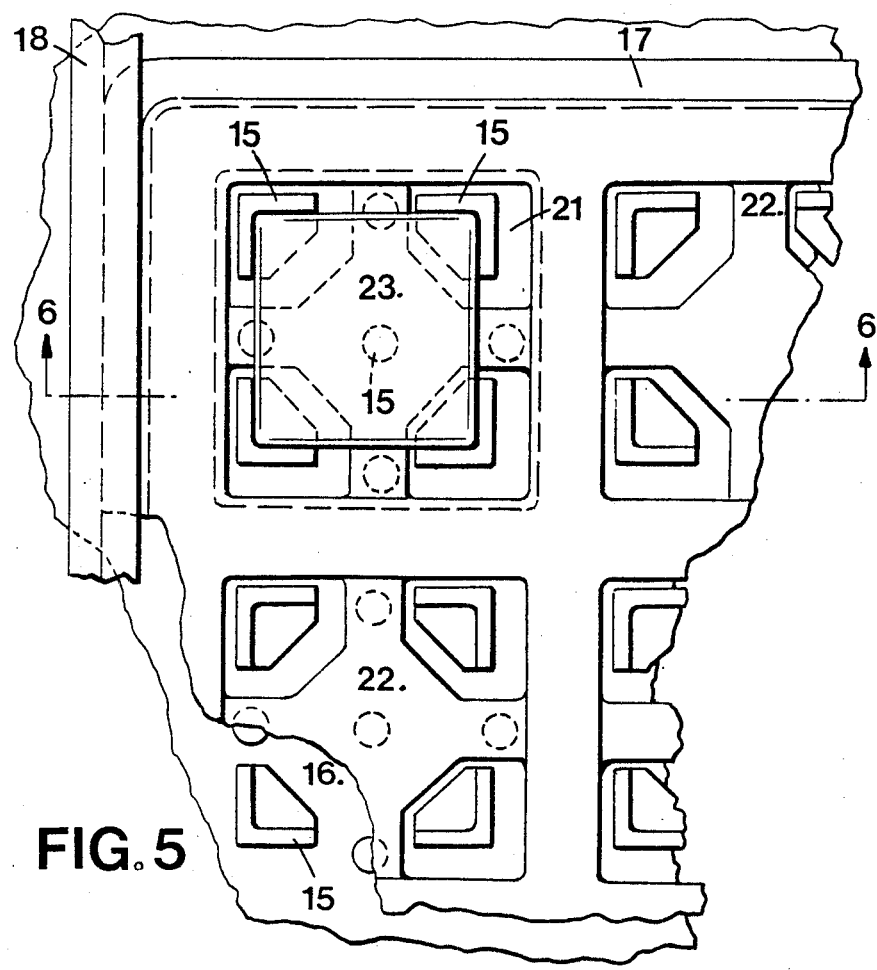
Figure 6:
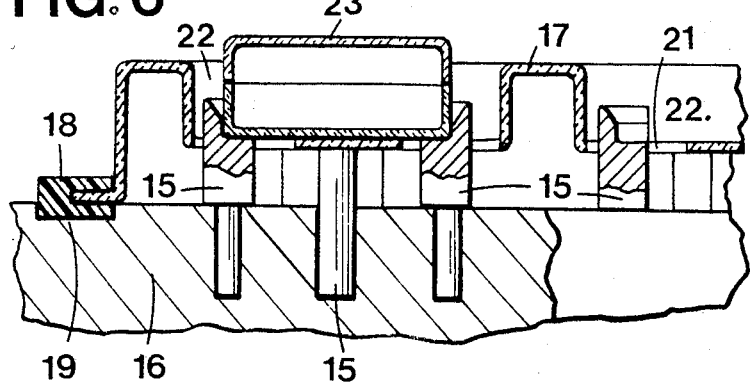
Figure 7:
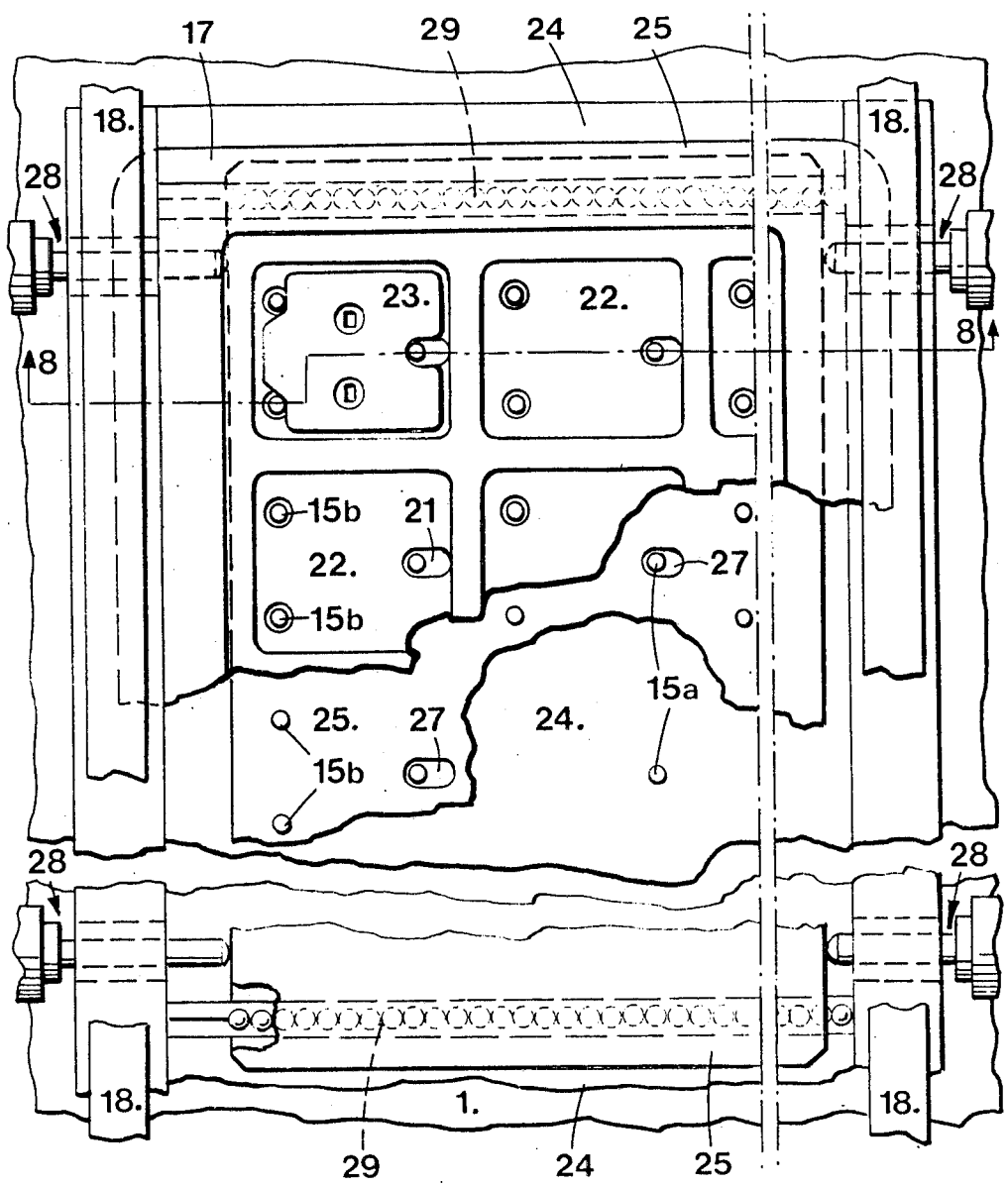

FIGS. 3 and 4, respectively 5 and 6 are fragmentary plan views or side views of two particular versions of the robot of the invention, and FIG. 7 and respectively 8 and 9 are a fragmentary paln view and fragmentary side views of yet another version of the robot of the invention.

Figure 1:
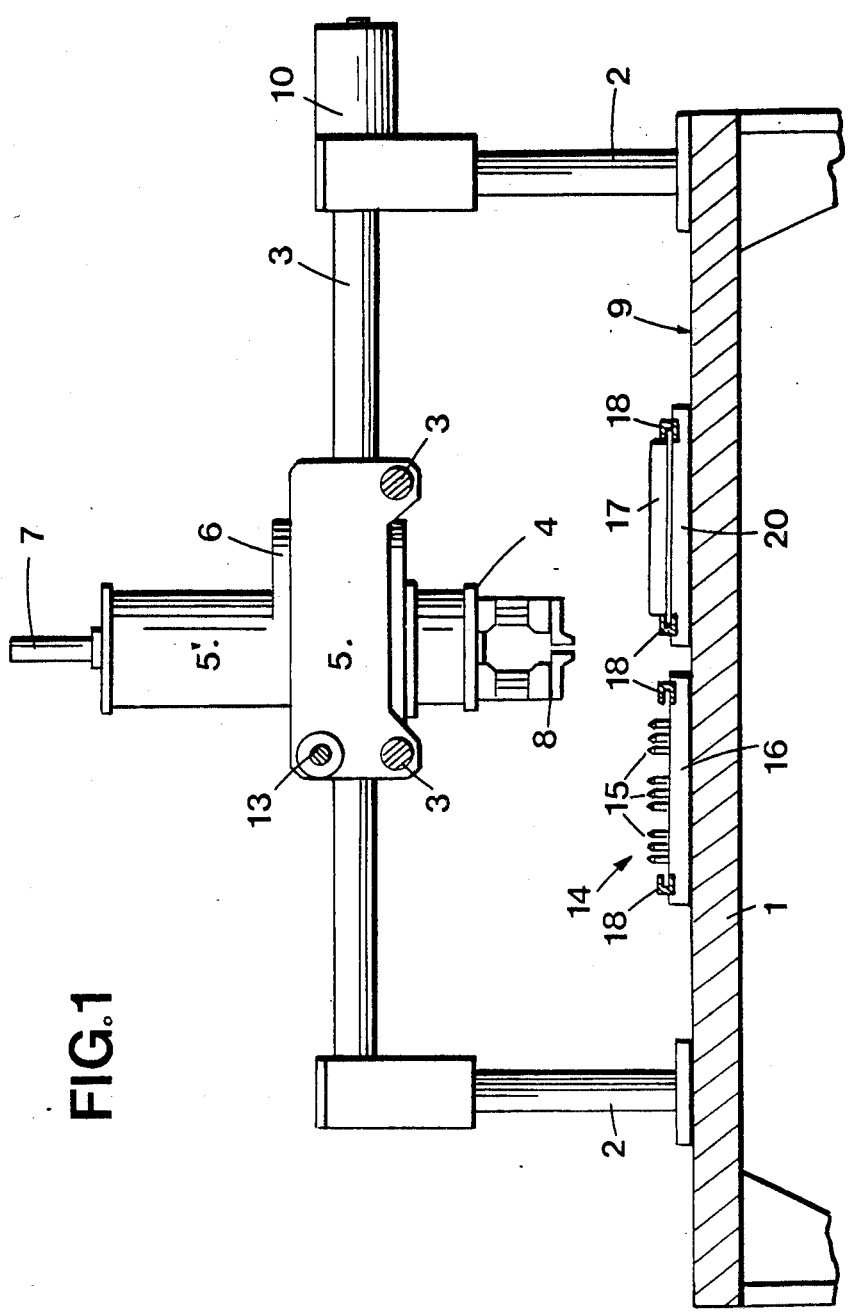
FIG. 1 is a side view of the robot according to the present invention.
Figure 2:
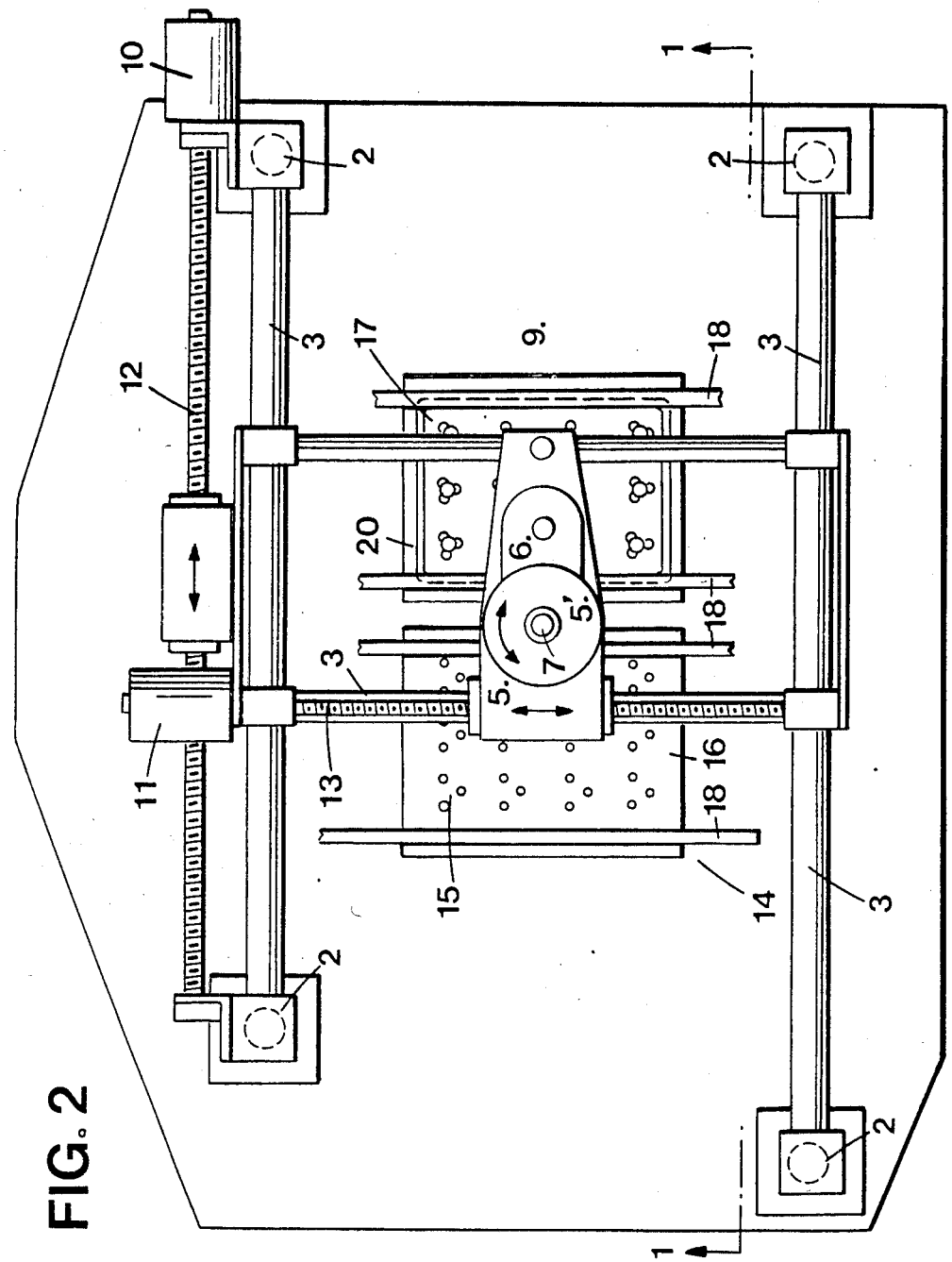
FIG. 2 is a plan view of the robot illustrated in FIG. 1.

Referring now to the embodiment of the invention illustrated in FIG. 1 and 2, the robot comprises a base 1 supporting the posts 2 on which are mounted the carrying means 3 for guiding at least one working head 4. Said working head comprises a main body 5 cooperating with the guiding means 3 on the top of which is mounted a housing 5' and a motor 6, or any other device capable of rotating said working head around its axis 7. It is for example through this axis 7 that the head 4 can be connected to the control means. In the embodiment shown in FIG. 1, the head 4 is provided with the prehensor fingers 8.

The various movements of the working head 4 which can move above the working area 9 with at least 3 degrees of freedom are generated and controlled through usual instruments, such as for example the servomotors 10, 11 driving the worms 12, 13. The working head 4 and its ancillary components are borne by the elements 12, respectively 13 and by the guiding means 3 in the usual manner;the sliding on the means 3 can be ensured by conventional means, such as rollers for example. The movements of the working head 4, as well as those of the tool 8 are controlled by a program. Further, the whole system is controlled by one or several microprocessors, or even by a computer.

The robot is provided at least in one part of the working area 9 with a device 14 providing for an accurate positioning of the parts to be manipulated. This device 14 comprises spaced rigid elements 15 which are integral with a removable holder 16. Said holder 16 is in fact preferably removable so that it can be replaced when desired by another holder 16 where the arrangement of the rigid elements 15 is different: consequently, the device 14 can be adapted at any time to the specific shape of the parts which are to be manipulated. Further, and according to the requirements, the holder 16 can be fixed to the base 1 by any appropriate means, such as screws, hooks, magnets, and the like.

The rigid elements 15 are disposed perpendicularly to the surface of the working area 9 and they extend above the holder 16. Said elements 15 can consist for example of pins having for example a conical, a frustoconical, a cylindrical, or a prismatic shape and appropriately fixed to said holder; such pins can be for example screwed or welded to the holder, or pressed-fitted. Further, the removable holder 16 will be constructed so as to be capable of withstanding mechanical stresses.

The manner in which the elements 15 are arranged on the surface of the holder 16 will depend on the nature of the objects which are to be manipulated, and in particular on their shape and on the orientation they are to be given.

According to the invention, the robot comprises at least one preformed removable receptacle 17, which is provided for transporting collectively the parts to be assembled to and from the working area 9, and which is configured to maintain with a certain tolerance said parts in relative positions and orientations similar to those determined by the device 14. Said receptacle 17 is further arranged to cooperate with the device 14 mentioned above.

The receptacle 17 can be for example a plate made of a thermoformable material which is provided with holes 21 configured to be passed through by the elements 15 when said receptacle is placed on the support 16 and with cups 22 for accommodating the parts to be manipulated with a sufficient clearance to tolerate a slight displacement of said parts under the effect of the positioning device 14.

Depending on the tasks assigned to the assembling robot, the receptacle 17 will be configured to enable the transport of one or several series of identical parts, or to enable the transport of one or several series of parts differing between themselves.

The operations of transporting and positioning accurately the parts to be assembled can be described as follows (FIGS. 3 to 6): first, the preformed receptacle 17 is filled outside the working area 9 with the selected parts 23, and then it is transported to the working area 9 by means of belts 18 sliding in appropriate guides or in the grooves 19 provided in the holder 16 of the device 14, or by means of a transport tray. 20. The receptacle 17 can be maintained in position for example by a nipping device, or by any other adequate means, and its movements can be controlled by the system controlling the rest of the robot assembly.

Once the preformed receptacle 17 is brought above the device 14, it is lowered by the desired distance, and the rigid elements 15 (for example pins with a cylindrical body and a conical head) pass through the holes 21 provided in the cups 22. At this moment, the parts 23 come closely in contact with said elements 15 to slide along them and adopt their final position defined accurately by the whole set of elements 15. In another version of the invention, the device 14 can be subjected to a vertical translation, while the receptacle 17 remains resting on the surface 9 of the base 1.

When the assembling operation is terminated, the receptacle 17 can be evacuated with the finished objects from the working area to a storage area for example.

Depending on the circumstances, the rigid elements 15 can be used for positioning laterally the parts to be manipulated as well as for positioning them vertically. The holes 21 provided in the cups 22 have preferably a section slightly larger than that of the corresponding elements 15 of the device 14.

In another version of the robot of the invention (FIG. 7 to 9), the positioning device 14 comprises a removable holder 16 comprised of two superimposed plates 24, 25 bearing the spaced rigid elements 15a, respectively 15b, said plates being movable one relatively to the other along at least one axis which is located on their common contact surface 26. The relative movements of the plates 24 and 25 can be provided for by any appropriate means, such as for example the means 28 comprising one or several jacks actioning the movable plate 25 from both its sides. Guiding means 29 ensure that the movement of said mobile plate 25 takes place along the desired direction: such means can comprise for example one or several pins engaged into corresponding grooves or a series of balls cooperating with grooves provided in the upper face and in the lower face of respectively the plate 24 and 25 (FIG. 7). The control of these movements can be programed in accordance with the overall assembling process.

In this particular embodiment, the upper plate 25 is provided with the holes 27 through which pass the elements 15a, which are integral with the plate 24. The section of these holes 27 and the section of the holes 21 of the receptacle 17 are calculated so as to enable the plate 25 to move by a sufficient distance to press the parts 23 between the rigid elements 15a and 15b.

Figure 8:
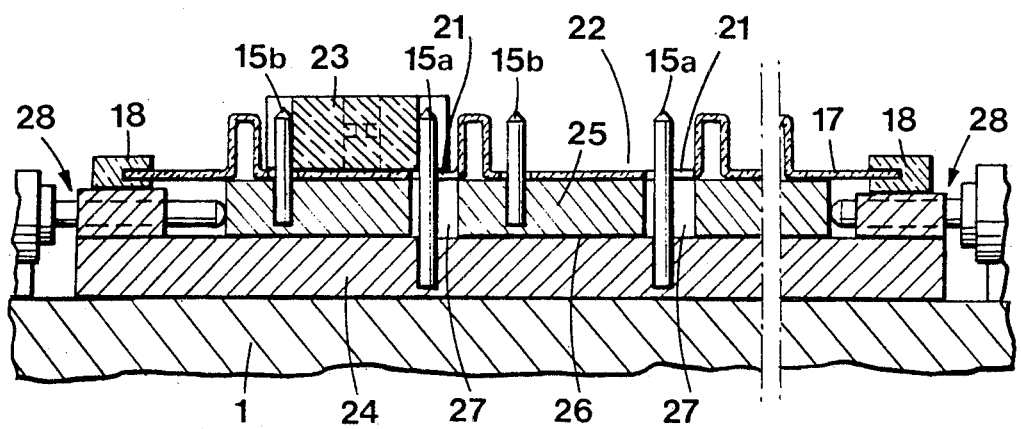
Figure 9:
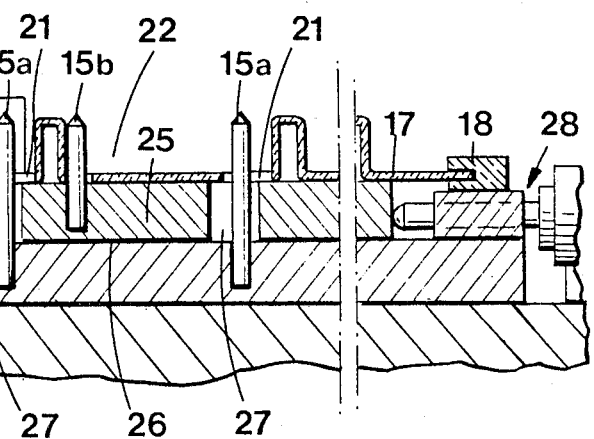

FIG. 8 is a sectional view taken along the line 8—8 of FIG. 7 and illustrates the manner in which the parts 23 are pressed between the elements 15a, 15b. In FIG. 9, the elements 15a, 15b are shown when they are moved apart by the means 28 and when the parts 23 are released from their grip.

The operations related to the transport of the parts 23 before and after their assembling are the same as was described previously. The accurate positioning of the parts 23 in predetermined positions and orientations is ensured by their gripping by the elements 15a, 15b.

It was found that the assembling method using the robot of the invention was well suited for assembling in series constitutive parts of objects, in particular when large series were involved. It is obvious that the process can also be applied to the assembling part by part of one object at the time.

I claim:

1. An assembling method for constitutive parts of objects, where said parts are accurately maintained in a working area (9) in predetermined positions and orientations by a positioning device (14) for their manipulation by at least one tool (8) carried by a working head (4) performing movements controlled by a program, characterized in that said parts are disposed before their assembling and outside the working area (99) in a receptable (17) configured to cooperate with the positioning device (14) and to maintain with a certain tolerance said parts in relative positions and orientations similar to those determined by the device (14), the receptacle (22) is transferred to the working area (9) and positioned in such a manner that each part contained in the receptacle comes in direct contact with at least a part of the elements of the positioning device (14), and when required, the receptacle (22) is removed from the working area (9) when the assembling operation is terminated, and further characterized in that the positioning device (14) comprises spaced rigid elements (15) integral with the removable holder (16) constructed to withstand mechanical stresses, said rigid elements (15) being disposed perpendicularly to the surface of the holder (16) and in that the receptacle (17) is provided with holes (21) configured in such a manner that the elements (15) pass through them when the receptable (17) is supported by the holder (16).

2. A method according to claim 1, characterized in that the receptacle (17) is configured for transporting one or several series of identical parts.

3. A method according to claim 1, characterized in that the receptacle (17) is configured for transporting one or several series of parts which are different between themselves.

4. The utilization of the method according to one of the claims 1, 2 or 3 for assembling in series the constitutive parts of objects.

5. A robot designed for assembling constitutive parts of objects comprising at least one working head (4) provided with a tool (8) for performing above the working area (9) with at least three degrees of freedom movements controlled by a program, further comprising in said working area (9) a device (14) for positioning accurately parts to be manipulated in predetermined positions and orientations, characterized in that it comprises at least one preformed removable receptable (17) for the collective transport of the parts to be assembled to and from the working area (9) which is configured to maintain with a certain tolerance said parts in relative positions and orientations similar to those determined by the device (14) and arranged to cooperate with the latter, and in that the positioning device (14) comprises spaced rigid elements (15) integral with a removable holder (16) constructed to withstand mechanical stresses, said rigid elements (15) being disposed perpendicularly to the surface of said holder (16), and in that the receptable (17) is provided with holes (21) configurated in such a manner that the elements (15) pass through them when the receptable (17) is supported by the holder (16).

6. A robot according to claim 1, characterized in that the positioning device (14) comprises a removable holder (16) consisting of two superimposed plates (24, 25) bearing respectively the spaced rigid elements 15a and 15b, said plates being constructed so that they can move one relatively to the other along at least one axis located on their common surface of contact.(26).

7. A robot according to claim 6, characterized in that the upper plate (25) is provided with holes (27) through which pass the elements 15a integral with the plate 24, and in that the section of the holes (27) as well as the section of the holes (21) of the receptacle (17) are calculated to enable the plate (25) to move by a sufficient distance to press the parts between the rigid elements (15a, 15b).

8. A robot according to one of claims 5, 6 or 7, characterized in that the receptable (17) is provided with cups (22) for accommodating the parts to be manipulated with a sufficient clearance to tolerate a displacement of the parts to be manipulated under the effect of the positioning device (14).

* * * * *